Figure 1:
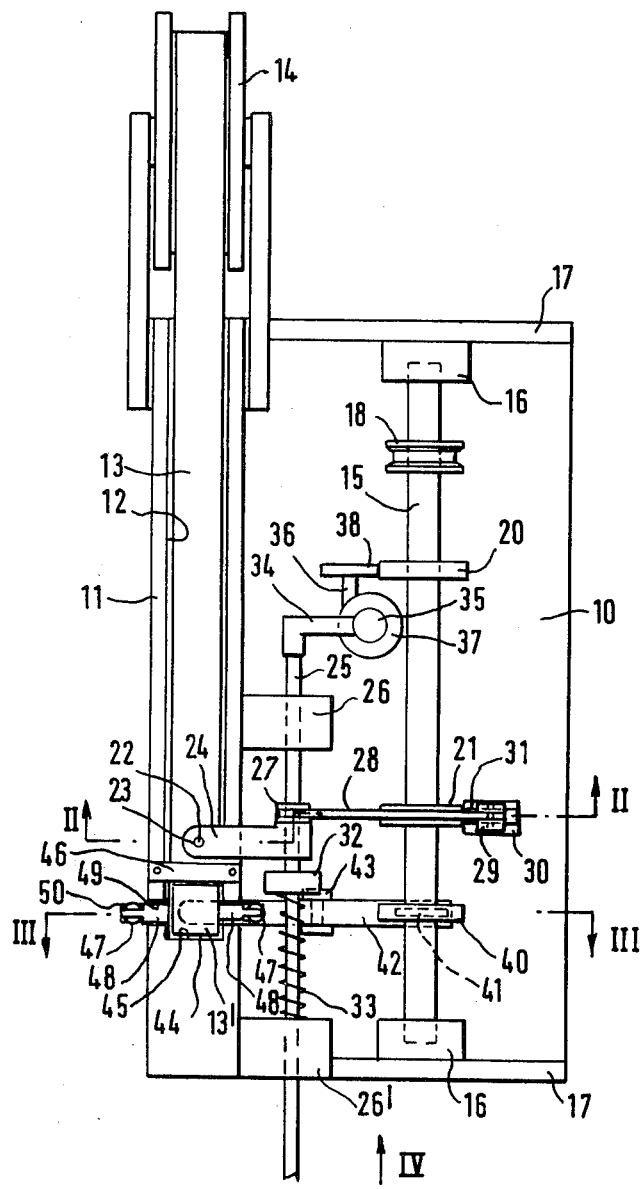

United States Patent [19]

Howarth et al.

[11] 3,958,742

[45] May 25, 1976

[54] MANUFACTURE OF SUPPORTS FOR SEMICONDUCTOR DEVICES

[75] Inventors: Geoffrey Howarth, Oldham; Sydney Jackson, Hayfield, both of England

[73] Assignee: Ferranti, Limited, Hollinwood, England

[22] Filed: Nov. 19, 1974

[21] Appl. No.: 525,201

[30] Foreign Application Priority Data

Nov. 24, 1973 United Kingdom............... 54644/73

[52] U.S. Cl.................................. 228/123; 228/14; 83/152
[51] Int. Cl.² ........................................ H01L 21/58
[58] Field of Search............... 29/473.1, 628, 630 R, 29/630 C; 228/13, 14, 123; 83/152, 276, 278

[56] References Cited

UNITED STATES PATENTS

| | | | |
|---|---|---|---|
| 1,589,176 | 6/1926 | Hubbard............................... | 83/278 |
| 3,032,862 | 5/1962 | Fastre et al................... | 29/630 C X |
| 3,585,711 | 6/1971 | Hicks................... | 29/473.1 |
| 3,667,331 | 6/1972 | Regel et al........................ | 83/152 X |

Primary Examiner—Al Lawrence Smith
Assistant Examiner—K. J. Ramsey
Attorney, Agent, or Firm—Cameron, Kerkam, Sutton, Stowell & Stowell

[57] ABSTRACT

Apparatus in which gold tape is to be servered and placed on selected parts of support members of supports for semiconductor devices has means to feed the tape to severing means including a reciprocatable dog to engage the tape. The dog may pierce or indent the tape, or may frictionally engage the tape.

2 Claims, 5 Drawing Figures

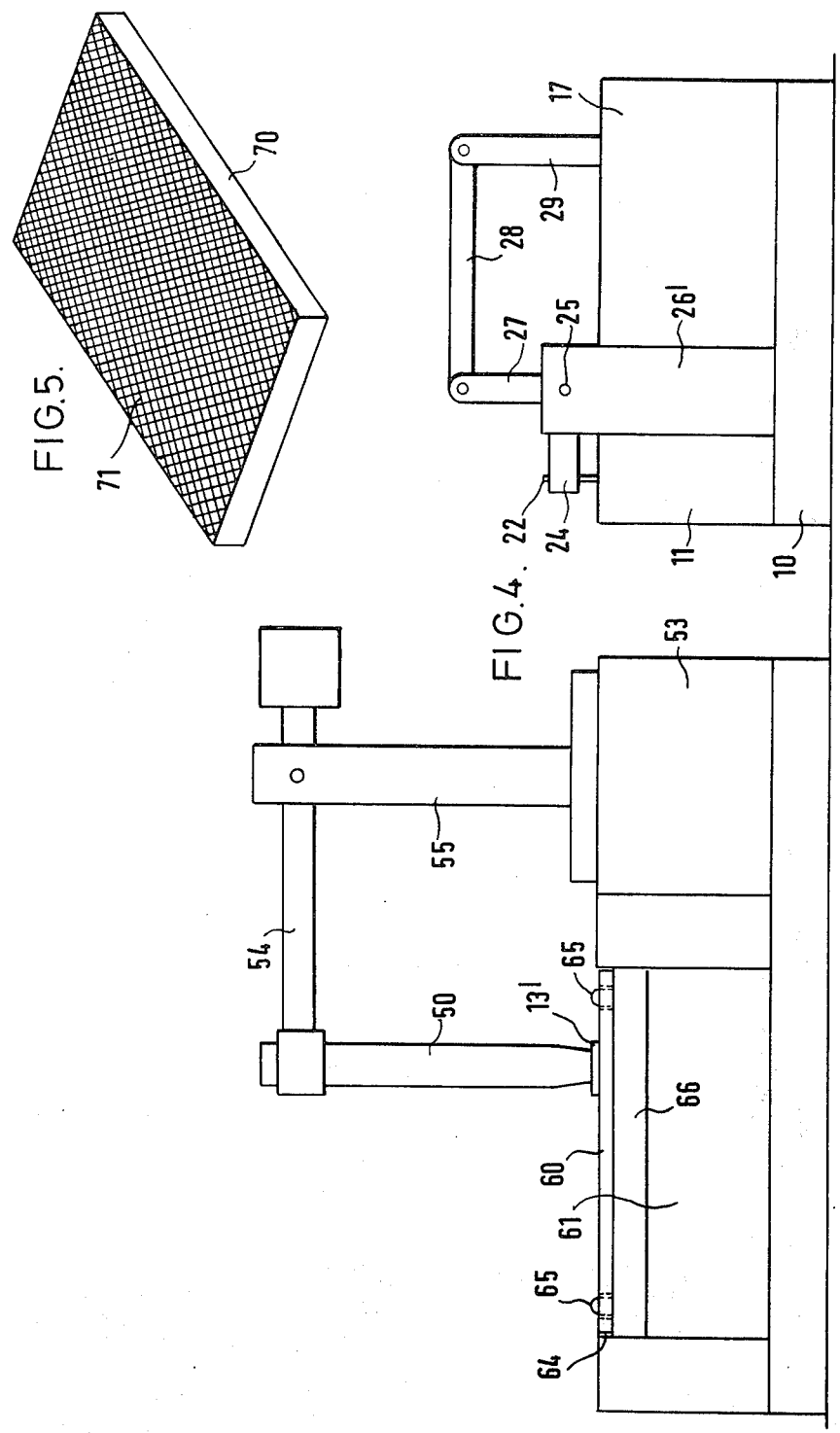

MANUFACTURE OF SUPPORTS FOR SEMICONDUCTOR DEVICES

This invention relates to the manufacture of supports for semiconductor devices.

A support, comprising part of a package in which a semiconductor device is encapsulated, and from which package extend conductors connected to contacts for the device, has a support member for the semiconductor device, and may have a support member comprising a conventional header arrangement or a preformed matrix of conductors of a lead frame. When the support member is a lead frame the device may be encapsulated in a plastics material such as an epoxy resin, and the package may comprise a so-called "flat-pack". The semiconductor device usually comprises a wafer, and may comprise a discrete circuit element such as a transistor, or it may comprise an integrated circuit. It is usual to provide between at least some of the device contacts and the conductors electrical interconnections in the form of small-diameter wires of gold or possibly of aluminium. A further electrical interconnection possibly also may be provided by bonding the semiconductor wafer to a conductor, comprising part of the support member, by an intermediate conducting layer of a suitable material to bond the device to the support member. Gold is one example of a suitable bonding material for a device in a silicon semiconductor body, the gold alloying with part of the silicon semiconductor body forming a eutectic mixture which when solidified secures the device to the support member, and which, when required, also provides an electrical interconnection therebetween. For convenience, hereinafter in this specification the term "support" is employed to refer to a support member for a semiconductor device, such as a header arrangement or a conductor matrix of a lead frame, and prepared in a form ready to receive the semiconductor device, having bonding material suitable to bond the semiconductor device to the support member. The term support member is employed to refer to such a structure which does not have material suitable to bond the semiconductor device thereto.

The whole of the appropriate face of the support member of the support may be coated with the bonding material, which is convenient if wires are also to be secured to the support member by the bonding material. When the bonding material is gold, gold or aluminium wires may be secured to a gold coated support member by known thermocompression bonding techniques. However, the thickness of gold on the part of the face of the support to which the device is to be bonded is required to be greater than the minimum thickness of the gold required on the parts of the face where small-diameter wires are to be thermocompression bonded. Alternatively, the parts of the appropriate face of the support except the part to which the semiconductor device is to be bonded may be substantially wholly without the bonding material. In order to avoid using an unnecessarily large amount of the bonding material, which material may be expensive, especially when the material is gold, it has been known either to electroplate selectively only the appropriate parts of the support or to apply an initially uniformly thick coating of the material to the whole of the appropriate face of the support member, and subsequently removing and recovering substantially all of the material not required for bonding the semiconductor device and, possibly, also for bonding wires to the support member. Alternatively, the bonding material for the semiconductor device is supplied initially in the form of a preformed blank of at least the minimum requisite dimensions to bond the semiconductor device to the support member, the blank being secured to the selected part of the support member by a scrubbing action. Either of the two first mentioned ways adds substantially to the complexity of manufacturing the support, and in the last mentioned way it is difficult to ensure that the preformed blank is reliably bonded to the support member.

It is also known to manufacture a support by supplying suitable bonding material in the form of a thin tape. The tape is severed into pieces, each piece of tape having at least the minimum requisite dimensions, when secured to the support member, to bond the semiconductor device to the support member. The pieces are secured to the selected parts of the support members, for example, by heating in situ. However, such a method does not lend itself readily to be performed by automatic apparatus when, as is known, the tape is fed to the severing means with a uniformly continuous motion by co-operating contra-rotating feed rollers, because the thin tape is difficult to manipulate in a reliable and wholly predictable manner by such apparatus. This difficulty arises because severed pieces of a malleable material, such as gold, tend to adhere to the severing means so that the severing means becomes choked. Further, the tape cannot be fed to the severing means in a reliable and positive way because the thin tape tends to flex in an uncontrollable manner whilst being fed by the contra-rotating rollers. Thus, such apparatus does not have a high throughput rate of satisfactorily manufactured supports.

In the commonly owned U.S. Pat. No. 3,771,212, there is described and claimed a method of manufacturing a support by impacting a sphere of the bonding material onto the selected part of the support member. By the impacting action the sphere is secured to the selected part of the support member and is spread in a satisfactory manner over the selected part to enable the semiconductor device subsequently to be bonded to the support member. Thus, for example, if the bonding material is gold and the surface of the selected part of the support member is of silver a thermocompression bond is formed between the bonding material and the support member. Further, a sphere may be handled and bonded to the support member quickly and in a wholly reliable manner by appropriate designed automatic apparatus.

It is an object of the present invention to provide apparatus for manufacturing supports for semiconductor devices, which apparatus includes means for severing a thin tape of the bonding material into pieces each of at least the minimum requisite dimensions to bond a semiconductor device to a support member of the support, the apparatus being such that the severed pieces of thin tape may be handled automatically both quickly, and in a reliable and wholly predictable manner.

According to the present invention apparatus for manufacturing supports for semiconductor devices comprises means for feeding to severing means a tape of material suitable to bond semiconductor devices to selected parts of support members of supports, the feeding means feeding the tape towards the severing means in a positive manner with an intermittent motion and including a reciprocatable dog to engage the tape in each repetitive forward movement of the tape, in each intervening period between repetitive forward movements of the tape towards the severing means the dog both being disengaged from the tape and being moved on the reverse part of the stroke of its reciprocating action, the stroke length of the reciprocating action of the dog, and hence the length of each piece of the tape severed by the severing means, in relation to the width and thickness of the supplied tape, being arranged to be such that the dimensions of the severed piece are sufficient to bond a semiconductor device to a support member after the severed piece of tape is secured to the support member, the apparatus also including means to hold individually and temporarily each severed piece of tape and, whilst the piece is held, both to remove the piece from the severing means in the intervening period between the corresponding forward movement of the tape and the next such forward movement, and to transfer the severed piece of tape to the selected part of the support member, where the tape piece is released by the holding means, and means to secure the severed piece of tape to the selected part of the support member.

The dog is required to be such that it engages the tape in a readily detachable manner. The tape may be deformed by the dog piercing or indenting the tape. Thus, the dog may comprise either a needle mounted with its longitudinal axis substantially normal to the plane in which the tape is fed to the severing means, and having only point contact with the tape, or a multi-toothed member. Alternatively, the dog may comprise means frictionally to engage the tape, and the tape is not deformed.

According to another aspect the present invention comprises a method of manufacturing a support for a semiconductor device, such a method being embodied in the apparatus referred to above.

According to still another aspect the present invention comprises a support for a semiconductor device when manufactured by such a method.

Figure 2:
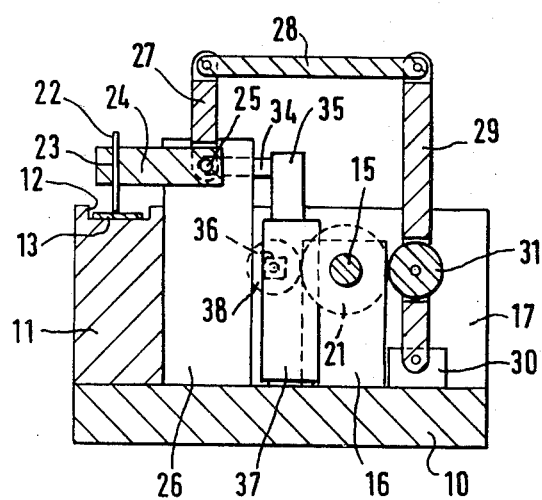
Figure 3:
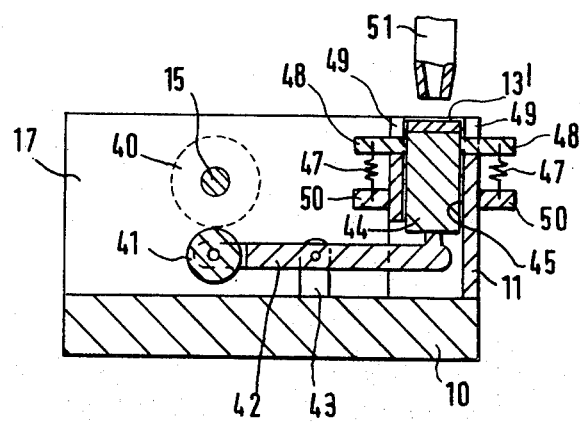

The present invention will now be described by way of example with reference to the accompanying drawings, in which, FIG. 1 is a plan view of part of automatic apparatus for manufacturing supports for semiconductor devices, in the apparatus material in the form of a tape, and suitable to bond semiconductor devices to selected parts of support members of the supports, being fed to severing means to obtain severed pieces of tape of dimensions sufficient to bond the semiconductor devices to the support members, after the severed pieces of tape are secured to the support members, FIG. 2 is a section on the line II — II of FIG. 1, showing means for feeding the tape to the severing means, the feeding means including a reciprocating dog comprising a needle to engage the tape, FIG. 3 is a section on the line III — III of FIG. 1, showing the means for severing the tape, and part of means for holding each severed piece of tape and for removing the piece from the severing means, FIG. 4 is an end elevation of the whole apparatus, and shows the means for transferring each severed piece of tape to a support member, and means for securing the piece of tape to the selected part of the support member of the support, in addition to showing the part of the apparatus of FIGS. 1 to 3 looking in the direction of the arrow IV of FIG. 1, and FIG. 5 shows diagrammatically an alternative construction for the reciprocating dog, this dog frictionally to engage the tape.

The part of the automatic apparatus shown in FIGS. 1 to 3, and for performing a method of manufacturing a support for a semiconductor device according to the present invention, comprises a base plate 10 on which is mounted a member 11 having a shallow horizontal extending channel 12. The channel 12 has a width and a depth sufficient to accommodate a thin tape of gold 13, the gold tape being provided initially on a reel 14 rotatably mounted at one end of the channel 12. The tape 13 is fed linearly along the channel 12 from the reel 14 by feeding means, shown in both FIGS. 1 and 2, and mounted on the base plate 10. Also on the base plate 10 is a horizontally extending drive shaft 15 mounted in bearings 16 at opposing sides of the base plate, the bearings 16 being secured to end plates 17 provided at these opposing sides. The drive shaft 15 extends parallel to the tape channel 12, and is driven at a constant speed by a motor (not shown), via a belt and pulley arrangement, there being shown in FIG. 1 alone, only a pulley 18 mounted on the drive shaft 15 of this arrangement.

In the tape feeding means two spaced cams 20 and 21 are mounted on the drive shaft 15, each cam 20 or 21 having a circular profile except for an extending notch. For convenience, in FIG. 1 each cam 20 or 21 is indicated as an un-notched disc substantially in continuous line form, and in FIG. 2, where only the second cam 21 is shown, this cam is indicated as an un-notched disc in broken line form.

The feeding means includes a vertically mounted needle 22 extending through a bore 23 in a carrier 24, the needle 22 being secured in the bore 23. The carrier 24 is rotatably mounted, at a point remote from the needle 22, on a horizontally extending shaft 25. The shaft 25 extends through bearings 26 and 26' mounted on the base plate 10 adjacent to the member 11 defining the tape channel 12, and the shaft 25 extends parallel to and slightly above the channel 12.

The carrier 24, extends generally horizontally, and is rigidly secured to a generally vertically extending lever 27 mounted to rotate with the carrier 24 about the shaft 25. The lever 27 is caused to rotate by operation of a linkage. The linkage comprises a tie bar 28 extending generally horizontally between the end of the lever 27 remote from the shaft 25 and the end of a generally vertically extending lever 29 remote from the pivot 30 of this lever 29. The tie bar 28 is rotatably connected to the levers 27 and 29. Rotatably mounted on the lever 29, intermediate between the tie bar 28 and pivot 30, is a cam follower 31 engaging the second cam 21. The rotational axis of the cam follower 31 is parallel to the drive shaft 15, and the cam follower 31 is biased into engagement with the cam 21 by a spring (not shown), one end of the spring being secured to the lever 29. The levers 27 and 29 extend vertically when the cam follower 31 is in engagement with the notch of the cam 21, in the position shown in FIG. 2. However, when the cam 21 rotates on the drive shaft 15, and the cam follower 31 moves out of the notch, the levers 27 and 29, in relation to the elevation of the apparatus of FIG. 2 rotate in a clock-wise direction. When the levers 27 and 29 extend vertically the arrangement is such that the needle 22 is in engagement with the tape 13. However, when the cam follower 31 moves out of the notch of the cam 21, the needle 22 is disengaged from the tape 13, and only re-engages with the tape when the cam follower again engages with the notch of the cam. This oscillatory action of the needle 22 is repeated for each revolution of the drive shaft 15.

The carrier 24 is secured to the shaft 25 for movement with the shaft 25 in a direction along its rotational axis. In each revolution of the drive shaft 15, the shaft 25, the carrier 24 and the needle 22 are caused to reciprocate together in a direction parallel to the tape channel 23, the shaft reciprocating in the bearings 26 and 26'. An enlarged-diameter collar portion 32 is provided on the shaft 25 between the carrier 24 and the adjacent bearing 26'. A spring 33 is held in compression between the collar 32 and the bearing 26', and biases the end of the shaft 25 remote from the bearing 26' to abut against an arm 34. The arm 34 extends radially from an upper smaller-diameter portion 35 of a vertical axle, the axle being rotatably mounted on the base plate 10. Another arm 36 extends horizontally, parallel to the drive shaft 15, and is generally tangential to a lower, larger-diameter portion 37 of the axle, the arm 34 being at right angles to the arm 36. A cam follower 38 is rotatably mounted on the end of the arm 36 remote from the axle, the rotational axis of the cam follower 38 being co-incident with the longitudinal axis of the arm 36. The spring 33 biases the cam follower 38 into engagement with the first cam 20. When the cam follower 38 is in engagement with the notch on the cam 20, in the position shown in FIG. 1, the arm 34 extends at right angles to the shaft 25, and the shaft 25, the carrier 24 and the needle 22 are held at the extremity of their reciprocating movement closest to the tape reel 14 (not shown in FIG. 2). When the cam follower 38 moves out of the notch of the cam 20, the arms 34 and 36 rotate in an anti-clockwise direction, in relation to the plan view of the apparatus of FIG. 1, and the shaft 25, the carrier 24 and the needle 22 move to the other extremity of their reciprocating movement remote from the tape reel 14, further compressing the spring 33. When the cam follower 38 again engages with the notch of the cam 20 the shaft 25, the carrier 24 and the needle 22 are moved to the extremity of their reciprocating movement closest to the tape reel 14 under the action of the spring 33.

The arrangement of the notches of the cams 20 and 21 is such that the needle 22 is in engagement with the tape 13 during each forward movement part of the reciprocation of the needle 22 parallel to the channel 12, this part of the movement being away from the tape reel 14 and towards severing means shown in FIGS. 1 and 3 and described below. At the extremity of this forward movement the needle disengages from the tape 13. The needle then moves out of engagement with the tape 13, on the reverse part of its reciprocating movement parallel to the channel 12, this part of the movement being away from the severing means and towards the tape reel 14. At the extremity of this reverse movement the needle re-engages with the tape 13. This reciprocation is repeated in each revolution on the drive shaft 15. Thus, the tape is fed with an intermittent motion towards the severing means along the channel 12. The needle deforms the tape at each engagement therewith, either indenting or piercing the tape, and hence the tape 13 is fed along the channel 12 in a positive manner. Further, the needle engages the tape in a readily detachable manner. Because only a thin tape 13 is being fed along the channel 12 it is essential for the reliable operation of the apparatus to prevent the tape inadvertently flexing upwards away from the base part of the channel. This feature is obtained with the feeding means of the apparatus according to the present invention because the tape is pulled, rather than pushed, along the channel. In addition, the feeding means is arranged such that the engaged portion of the tape is engaged by the reciprocating dog as close as possible to the severing means at the extremity of each foward movement of the dog towards the severing means. Thus, the tap is engaged by the needle sufficiently close to the severing means so that the tape is fed to the severing means in the required reliable and predictable manner.

The severing means for the tape is shown in FIGS. 1 and 3. For clarity, in FIG. 3 parts of the tape feeding means of FIGS. 1 and 2 are not shown. The severing means, which also is mounted on the base plate 10, is also driven by the drive shaft 15 rotating at a constant speed (the bearings 16 not being shown in FIG. 3). In the severing means a cam 40 is mounted on the drive shaft 15, this cam 40 also having a circular profile except for an arcuately extending notch. Again, for convenience, in FIG. 1 the cam 40 is indicated as an un-notched disc. in continuous line form, and in FIG. 3 as an un-notched disc in broken line form.

The cam 40 is engaged by a cam follower 41 rotatably mounted vertically below the drive shaft 15 at one end of a generally horizontal lever 42, the lever being pivoted at 43 adjacent to its mid-point. The other end of the lever 42 abuts against the lower end of a vertically movable knife 44. The knife 44 is displaceable in a vertically extending bore 45 in the member 11 in which the tape channel 12 is defined, the knife 44 being a sliding fit in the bore 45. The knife and the bore each have a generally square horizontal sectional shape. As shown in FIG. 1, the side wall facing towards the reel 14 of the upper part of the movable knife 44 is capable of abutting against a fixed knife 45 secured over the channel 12, (the fixed knife 45 not being shown in FIG. 3). Thus, any piece 13' of the tape which protrudes beyond this end of the channel 12 is severed between the movable knife 44 and the fixed knife 45 by the displacement of the upper part of the movable knife beyond the base part of the channel.

The movable knife 44 is biassed to move in a downwards direction by two vertically extending springs 47, a spring 47 being provided one on either side of the member 11 in which the bore 45 for the movable knife 44 is defined. Each spring 47 extends in compression between a lug 48 on the upper part of the movable knife 44, each lug 48 extending through a slot 49 in the member 11, and a lower anchorage 50 secured to the member 11. The springs 47 bias the cam follower 41 into engagement with the cam 40. The lever 42 extends horizontally when the cam follower 41 is in engagement with the notch of the cam, in the position shown in FIG. 3. However, when the cam 40 rotates on the drive shaft 15, and the cam follower 41 moves out of the notch, the lever 42, in relation to the elevation of the apparatus of FIG. 3, rotates in an anti-clockwise direction. This causes the upper part of the movable knife 44 to pro'rude from the bore 45 and to sever any piece 13' of the tape which extends beyond the end of the channel 12. The upper part of the movable knife 44 returns wholly within the bore 45, under the action of the springs 47, when the cam follower 41 again engages with the notch in the cam 40. This ocillatory action of the movable knife 44 is repeated from each revolution of the drive shaft 15.

The arrangement of the notch of the cam 40 of the severing means, in relation to the arrangement of the notches of the cams 20 and 21 of the tape feeding means, is such that the piece 13' of the tape, protruding beyond the end of the channel 12 after a forward movement of the tape 13 from the reel 14 by the feeding means, is severed by the severing means.

The severed piece of tape 13' extends over the square-shaped end of the movable knife 44. However, because the tape is of a malleable material such as gold, the severed piece tends to adhere to the fixed knife 46, and is difficult to handle. Hence, in the intervening period between the forward movement of the tape 13 towards the severing means and the next such repetitive forward movement, whilst the tape is stationary, the severed piece of tape 13' is held by a suction nozzle 51 shown partially in FIG. 3. The suction nozzle 51 is mounted on another part of the automatic apparatus, and is shown in FIG. 4. The suction nozzle 51 is connected to a source of suction, and to indexing means of a conventional construction, indicated generally at 53, by an arm 54 pivotally mounted on a a vertically extending axle 55 of the indexing means. The indexing means is arranged to be such that, in each intervening period between repetitive forward movements of the tape 13 towards the severing means, the nozzle 51 is moved vertically downwards to hold the severed piece of tape 13' whilst it is over the movable knife 44. The nozzle 51 and the severed piece of tape 13' are then displaced vertically upwards by the indexing means, and so the nozzle positively and reliably removes the severed pieces of tape 13' from the severing means whilst the remaining unsevered part of the tape 13 is stationary. This feature of the apparatus, together with the positive feeding of the tape towards the severing means, ensures that the severing means does not become choked with unremoved severed pieces of tape. Hence, the tape is fed to the severing means, and the severed pieces of tape are removed from the severing means quickly and in a reliable and predictable manner.

The indexing means also transfers the severed piece of tape 13' to a support member comprising a lead frame 60 with a matrix of conductors, and the lead frame 60 is shown in FIG. 4 mounted in yet another part 61 of the automatic apparatus. FIG. 4 is an end elevation of the whole of the automatic apparatus, and shows the suction nozzle 51 and a severed piece of tape 13' on a selected part of the lead frame 60. By rotating the arm 54 carrying the suction nozzle 51, about the vertical axle 55, through 180°, the indexing means causes the severed piece of tape 13' held by the suction nozzle to be transferred from over the severing means to above the selected part of the lead frame. The indexing means also causes the severed piece of tape to be lowered on to the lead frame, as shown in FIG. 4. Subsequently the nozzle 51 is caused to release the severed piece of tape and to return to hold the next severed piece of tape over the severing means, the indexing means being arranged to be actuated in the required sequence in relation to the tape feeding means and the severing means for this purpose.

The severed piece of tape 13' may be transferred to the selected part of the lead frame in the intervening period between the corresponding forward movement of the tape and the next such forward movement.

The lead frame 60 is part of an integral strip of lead frames, the strip being a sliding fit in a channel 64 in the part 61 of the apparatus. Fingers 65 of an indexing mechanism (not otherwise shown) engage the lead frame strip in the channel 64 and displace the strip with an intermittent motion. Each lead frame 60 of the strip is moved by the fingers into an operable position, such that the nozzle 51 can deposit a severed piece of tape onto the selected part of the lead frame. The arrangement is such that the lead frame strip is moved in the required sequence with the tape feeding means, the severing means, and the indexing mechanism of the piece transferring means of the apparatus.

A heated platen 66 extends longitudinally along the base part of the channel 64, and causes each deposited piece of tape 13' to be heated in situ so as to secure it to the selected part of the lead frame. When secured to the lead frame the bonding material of the tape provides a coating of uniform thickness on the selected part of the lead frame, even though the severed piece of tape has been deformed by the tape feeding means. The severed piece of tape 13' may be secured to the selected part of the lead frame in the intervening period between the forward movement of the tape and the next such repetitive forward movement.

The stroke length of the feeding means is determined by the arrangement of the arms 34 and 36, the axle 35, 37, the cam follower 38 and the cam 20, including the depth of the notch in the cam 20. The stroke length determines the length of each severed piece of tape. This length is arranged, in relation to the width and thickness of the supplied tape, to be such that the severed piece of tape has at least the minimum required dimensions to enable the semiconductor device to be bonded to the selected part of the support member. In one particular embodiment of apparatus according to the present invention a tape 1 millimeter wide and 25 microns thick is moved 1 millimeter in each forward movement of the reciprocating dog. The dog engages the tape up to 5 millimeters away from the point at which the tape is severed.

In different apparatus, or in another unillustrated part of the apparatus according to the present invention, the material secured to the selected part of each lead frame is bonded to one major face of a semiconductor wafer (not shown). When the semiconductor wafer is of silicon and the bonding material is gold a gold-silicon eutectic is formed to bond the semiconductor wafer to the lead frame. If a transistor is formed in the semiconductor wafer, the collector is bonded to the selected part of the lead frame, which selected part is integral with one of the three conductors of the lead frame, the gold-silicon eutectic forming an electrical interconnection between the selected part and the collector. Subsequently, gold wire electrical interconnections are bonded to emitter and base contacts provided on the major face of the semiconductor wafer opposite to the major face bonded to the selected part of the lead frame. The ends of the wires remote from the device then are thermo-compression bonded to the other two conductors of the lead frame. For this purpose the other two conductors of the lead frame have a gold coating which is not as thick as that required on the selected part of the lead frame. The semiconductor devices on a lead frame strip are encapsulated in epoxy resin, and the lead frames of the strip are separated from each other. The conductors of each lead frame are removed from the other parts of the lead frame so that electrically discrete conductors extend from each package comprising an epoxy encapsulated semiconductor device.

The dog of the feeding means which deforms the tape, and engages the tape in a readily detachable manner, may have any convenient structure, and need not comprise a needle and, for example, may comprise a multi-toothed member. However, a needle is especially advantageous for this purpose as there is only point contact made with the tape.

The dog of the feeding means may positively engage the tape by frictional engagement, and so does not deform the tape. FIG. 5 shows diagrammatically such a dog comprising a metal member 70 having a coarse or a roughened plane surface 71 to engage the tape. Alternatively, such a dog may be provided by a rubber pad. Any such dog frictionally engages with the tape in a readily detachable manner.

A reciprocating motion may be imparted to the dog and to the severing means by any conventional arrangement for this purpose, instead of the construction described above.

The means for holding each severed piece of tape, for removing the piece from the severing means, and for transferring the piece to the support member also may have any suitable known construction.

A larger semiconductor device than a transistor, for example, an integrated circuit, may be bonded to a selected part of a lead frame, and an electrical interconnection may not be provided by the material bonding the device to the lead frame.

The bonding material, initially supplied in the form of a tape, may be other than of gold.

The support manufactured by the method according to the present invention may comprise, for example, a conventional header arrangement instead of a lead frame, the severed piece of tape being deposited on the selected part of the header when the header is mounted on suitable automatic feeding means.

What we claim is:

1. Apparatus for manufacturing supports for semiconductor devices comprising means to feed a tape, means to sever the tape into pieces, means to hold individually and temporarily each severed piece of tape, and means to secure the severed pieces of tape to selected parts of support members of supports, the tape being of a material suitable to bond semiconductor devices to the selected parts of the support members, the length of each severed piece of tape, in relation to the width and thickness of the supplied tape, being arranged to be such that the dimensions of the severed piece are sufficient to bond a semiconductor device to a support member, the feeding means including a reciprocatable dog to feed the tape towards the severing means in a positive manner with an intermittent motion, the dog engaging the tape in each repetitive forward movement of the tape towards the severing means, in each intervening period between repetitive forward movements of the tape the dog both being disengaged from the tape and being moved on the reverse part of the stroke of its reciprocating action, the stroke length of the reciprocating action of the dog determining the length of each severed piece of tape, the dog comprising a needle mounted with its longitudinal axis substantially normal to the plane in which the tape is fed to the severing means, and having only a point contact with the tape during the forward movement of the tape toward the severing means, and the holding means being arranged both to remove each tape piece from the severing means in the intervening period between the corresponding forward movement of the tape and the next such forward movement, and to transfer the severed piece of tape to the selected part of the support member, where the tape piece is released by the holding means.

2. A method of manufacturing a support for a semicondutor device comprising the steps of providing in the form of a tape material suitable to bond semiconductor devices to selected parts of support members of supports, feeding the tape with an intermittent motion to severing means, the tape being fed in each repetitive forward movement in a positive manner to the severing means by engagement with a reciprocating dog having only a point contact with the tape, in each intervening period between repetitive forward movements of the tape towards the severing means the dog both being disengaged from the tape and being moved on the reverse part of the stroke of its reciprocating action, severing a piece of tape, the stroke length of the reciprocating action of the dog, and hence the length of the severed piece, in relation to the width and thickness of the supplied tape, being arranged to be such that the dimensions of the severed piece are sufficient to bond a semiconductor device to a support member after the severed piece of tape is secured to the support member, holding individually and temporarily the severed piece of tape and, whilst the piece is held, both removing the piece from the severing means in the intervening period between the corresponding forward movement of the tape and the next such forward movement, and transferring the severed piece of tape to the selected part of the support member, where the tape piece is released by the holding means, and securing the severed piece of tape to the selected part of the support member.

* * * * *